(12) United States Patent
Shashoua (10) Patent No.: US 7,391,875 B2
(45) Date of Patent: Jun. 24, 2008

(54) PEAK-LIMITING MIXER FOR MULTIPLE AUDIO TRACKS

(75) Inventor: Meir Shashoua, Tel Aviv (IL)

(73) Assignee: Waves Audio Ltd., Tel Aviv (IL)

( * ) Notice: Subject to any disclaimer, the term of this patent is extended or adjusted under 35 U.S.C. 154(b) by 210 days.

(21) Appl. No.: 10/871,551

(22) Filed: Jun. 21, 2004

(65) Prior Publication Data

US 2005/0281418 A1    Dec. 22, 2005

(51) Int. Cl.
 H04B 1/00     (2006.01)
 H03G 3/00     (2006.01)
 H03G 7/00     (2006.01)
 H03G 9/00     (2006.01)
 G10L 21/00    (2006.01)

(52) U.S. Cl. ............... 381/119; 381/106; 381/102; 381/107; 381/104; 704/224; 704/225

(58) Field of Classification Search ........ 381/119, 381/106, 102, 19, 307, 55, 56; 704/224, 704/225; 700/94
See application file for complete search history.

(56) References Cited

U.S. PATENT DOCUMENTS

| | | | |
|---|---|---|---|
| 4,567,607 A * | 1/1986 | Bruney et al. ................ 381/1 |
| 4,843,626 A * | 6/1989 | Werrbach .................. 381/107 |
| 5,402,500 A | 3/1995 | Sims, Jr. | |
| 5,530,767 A * | 6/1996 | Yoshida ...................... 381/72 |
| 6,041,080 A * | 3/2000 | Fraisse ....................... 375/242 |
| 6,501,717 B1 * | 12/2002 | Yamazaki ................ 369/47.16 |
| 6,564,182 B1 * | 5/2003 | Gao ........................... 704/207 |
| 6,795,560 B2 * | 9/2004 | Hamamatsu ................ 381/119 |
| 7,013,011 B1 * | 3/2006 | Weeks et al. ............... 381/98 |
| 2004/0008851 A1 * | 1/2004 | Hagiwara .................. 381/104 |
| 2004/0213420 A1 * | 10/2004 | Gundry et al. ............. 381/104 |

OTHER PUBLICATIONS

Applicant's admitted prior art (Figures 2-6, p. 14, line 1, line 3; p. 24, lines 29-30).*
Applicant's admitted piror art (Figures 2-6, p. 14, line 1, line 3; p. 24, lines 29-30; p. 24, lines 5-16 and 29-30.*
Waves L360 UltraMaximizer Software Audio Processor User's Guide., Oct. 5, 2002.*
"L1 Plug-in Manual" Waves L1 software guide, pp. 1-20, Jan. 1994.
"L2-UltraMaximizer Software audio processor User's Guide" Waves L2 software guide, pp. 1-18, Jan. 1991.
"L3-Mulitmaximizer Software audio processor User's Guide" Waves L3 software guide, pp. 1-26, Aug. 2004.

* cited by examiner

*Primary Examiner*—Vivian Chin
*Assistant Examiner*—Devona E Faulk
(74) *Attorney, Agent, or Firm*—Browdy and Neimark (57) ABSTRACT

A method for processing audio signal that includes receiving a plurality of digital audio signals and calculating signal levels of them. The next step is calculating smooth attenuation signal for each one of the input audio signals. The smooth attenuation signals are calculated according to the signal levels and smoothing criteria, such that the mixing of signals that include the input audio signals multiplied by their respective smooth attenuation signals is peak limited by a given threshold level.

57 Claims, 6 Drawing Sheets

PEAK-LIMITING MIXER FOR MULTIPLE AUDIO TRACKS

FIELD OF THE INVENTION

The present invention relates to mixing of multiple audio tracks while assuring the resulted mixed signal is peak-limited. The audio tracks may be multiple audio tracks in a mixing environment, may be generated by band-splitting audio signals to multiple bands, mix-down of multi-channels surround formats, or any other situation where mixing of multiple audio signals is required.

BACKGROUND OF THE INVENTION

Peak-limiting of audio signals is a very common practice is the audio industry throughout the process of recording, mixing, mastering, production, and distribution of audio content. Unprocessed audio content has a wide dynamic range, while all the common distribution media for audio content available today, including radio broadcasting, internet broadcasting, audio CD, DVD, and more, have a limited dynamic range. Further more, production requirements, and different listening-environment conditions, often require limiting the dynamic range of audio content.

Audio peak-limiters reduce the dynamic range of the audio signal, more specifically, peak-limiters reduce the dynamic range by ensuring the signal will not exceed a certain threshold, while maximizing the RMS of the resulted audio signal, and minimizing audible distortions.

Audio peak-limiters are very common in the audio industry, and are available for decades, ranging from the simplest analog audio 'clipper' to sophisticated digital-domain peak limiters. The technology of peak-limiters has improved since its beginning, allowing for better and deeper peak-limiting, with fewer unwanted audible artifacts. Since 1990 peak-limiters became a must tool in every commercial music production and radio broadcasting, as they were used to maximize the RMS output possible for the given limitations of the distribution media. As a result, there is constantly a strong demand to further improve the technology and achieve deeper peak-limiting, with fewer unwanted audible artifacts.

Smooth Attenuation Signal

Figure 1A:
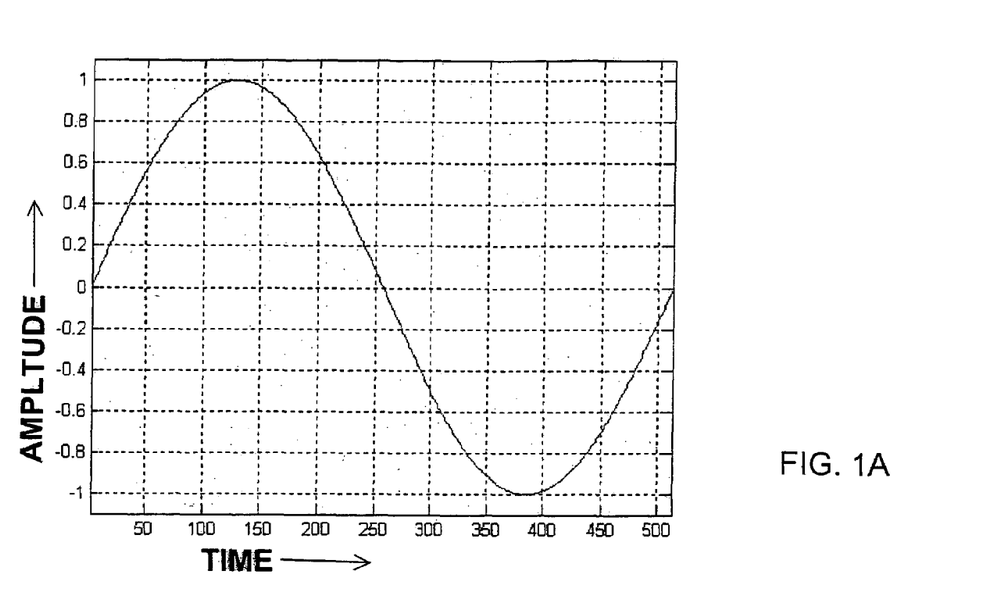
Figure 1B:
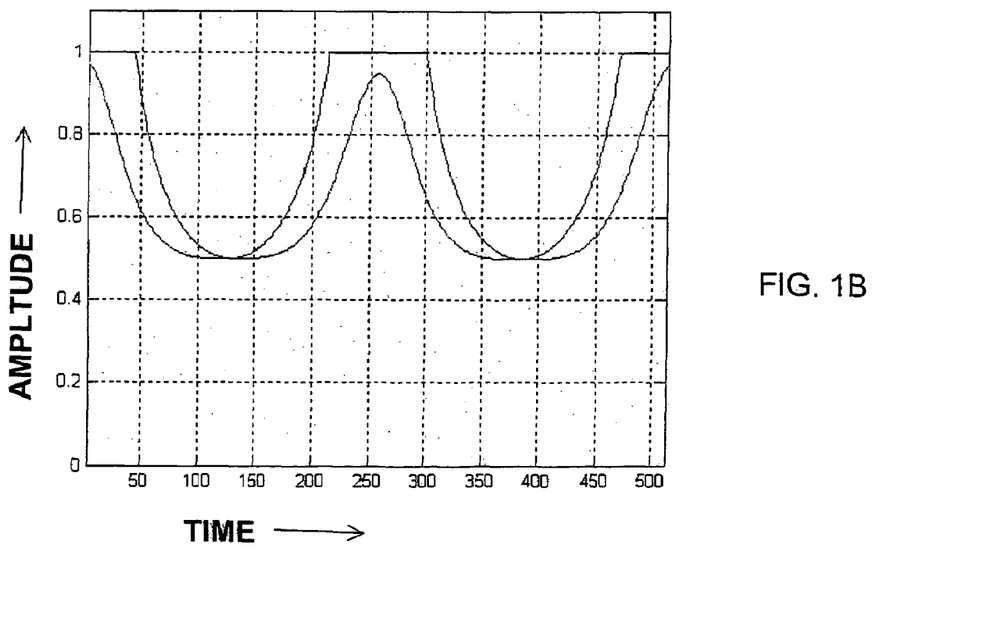
Figure 1C:
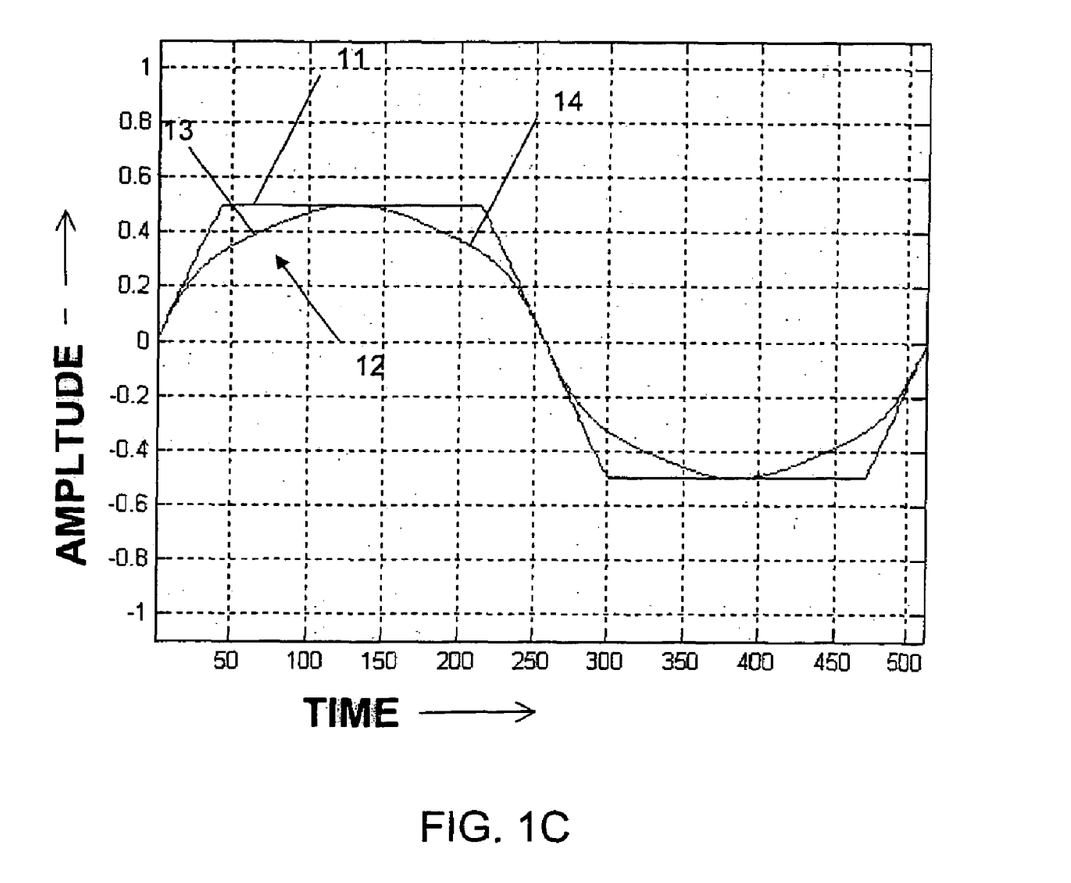

The design goal for a peak limiter is to prevent the signal from ever exceeding a given threshold, while maximizing the output signal RMS, and minimizing unwanted audible side effects. While simple signal clipping can achieve peak-limiting, it has severe unacceptable audible distortions. To avoid these severe distortions typical to signal clipping, peak limiters apply a smooth attenuation signal to the audio signal. The smooth attenuation signal is derived such that peak-limiting is achieved, while the control signal is smooth enough to minimize unwanted audible distortions. Thus, deriving the smooth attenuation signal is an essential part of a good peak limiter. FIG. 1A to C show the difference between a clipped signal and a peak-limited signal, in this example the peak-limited signal uses look-ahead smoothing. In FIG. 1.A. the original sine wave is shown. In FIG. 1.B. two control signals are shown, one that will result in clipping, and a smoothed version of it. In FIG. 1.C. the resulting clipped and peak-limited signals are shown.

Prior art techniques to derive the smooth attenuation signal include proper selection of the attack and release attenuation signal smoothing time constants, look-ahead techniques, and the peak-limiter's input-output curve shape. A peak limiter should have very fast response for signal attacks; otherwise peak-limiting will not be achieved. One prior art technique for increasing the attack time while achieving peak-limiting, is the use of look-ahead. Look-ahead peak limiters use delay lines on the input signal, so that they can anticipate the peaks before they reach the output. By aligning the attack smoothing to the look-ahead time, improved peak-limiting can be achieved, with slower attack times. Typical attack time constants used in peak limiters are instant attack when no look-ahead is used, and few milliseconds when look-ahead is used. The release smoothing of a peak limiter has no effect on the peak-limiting itself, rather on the RMS of the resulting peak limited signal. Longer release times will sound less distorted, but will also have lesser RMS, because signal attenuation stays for longer times after the peaks. In order to optimize the tradeoff between RMS and amount of perceived distortions, some prior art peak limiters use adaptive release time technologies, where the release time is dynamically adjusted according to the signal being processed. Typical release time constants used in peak limiters are between few milliseconds to several hundred milliseconds, depending on the type of signal being limited, and the amount of limiting applied. It is to be noted that release time constants are typically much longer than attack time constants.

Inter-Modulation Distortions in Prior Art Peak Limiters

While considerably reducing audible distortions through proper attenuation signal smoothing, prior art wide band peak limiters are subjected to inter-modulation distortions between different instruments and different frequency bands in the audio mix.

Multi Bands Peak Limiters

One prior art technique to reduce inter modulations is multi bands peak limiter. In a multi bands peak limiter the input audio signal is split into several frequency bands, and each band is limited individually before mixing them back. Usually another wide band peak limiter is applied to the signal after mixing to ensure precise peak-limiting. This approach is sub-optimal since it either peak limits each band separately before mixing while ignoring information from the other bands (in the individual bands peak limiters), or peak limits the signal after mixing, while ignoring information from the individual bands (in the peak limiter after mixing).

Multi Tracks Peak Limiters

Similarly another common prior art technique in multi track audio mixing, is to peak limit each audio track individually before mixing, and to apply yet another peak limiter to the mixed signal. This approach is also sub-optimal for similar reasons to prior art multi bands peak limiters.

In the prior art invention described in U.S. Pat. No. 6,501,717 both the signals of the tracks before mixing and the prediction of the resulted mix are analyzed in conjunction, and attenuation is applies to each track before mixing so as to prevent the mix from overflowing. U.S. Pat. No. 6,501,717 concerns Level detectors that detect levels of digital audio signals of individual channels. A controller predicts whether or not an overflow will take place corresponding to detected signals. When the controller predicts an occurrence of an overflow, attenuators attenuate a signal level of at least one channel. In addition, when variable length delaying devices vary the phases of signals, an overflow can be prevented.

While this system offers a potential improvement over its prior art, it can only achieve sub optimal results for peak-limiting. One limitation of the '717 patent is that it does not relate to the effects of the smooth attenuation signal, which is essential for high quality peak-limiting. As shown in the '717 patent, this system relates only to the signals before mixing, but not to the attenuated signals, or to the smooth attenuation gain signals themselves. In the context of a peak limiter, failing to relate to the prediction of the smooth attenuation gain will lead to suboptimal results. This can be understood by noticing that if at some instant a certain track should anyhow be attenuated, regardless of its value, due to attenuation signal smoothing considerations, than attenuation of other tracks may be relieved proportionally, while still achieving peak-limiting of the mixed signal. Thus failing to relate to the attenuation imposed by the smoothing considerations will lead to sub optimal (too much) attenuation overall. Note that the '717 patent discloses that the level attenuation process is of the order of several seconds. For certain applications such as peak limiting, much shorter time constants should be used, in order to maximize the RMS of the peak limited signal, see for example the L1-UltraMaximizer and L2-UltraMaximizer products commercially available from Waves Audio Ltd.

U.S. Pat. No. 5,402,500 discloses an improved audio mixing system. The system is not limited to one type of microphone and does not depend on separate sensing microphones to determine the background noise level. In addition, the active signal is not amplitude modulated by extraneous noise inputted through inactive microphones. The mixing system divides the system gain between a plurality of input channels. The mixing system periodically samples the channels and determines which channel is the dominant channel. In response to this determination, the gain of the dominant channel is increased and that of the other channels decreased.

There is a need in the art for improved peak-limiting, while still processing the individual tracks before being mixed.

Terms and Definitions

There follows a list of known terms. The definitions are provided for clarity only and are by no means binding Clipping includes: Clipping a signal S(t) to a threshold T can be formulated as follows: $CS(t)=\min(T, \max(-T,S(t)))$. Normally, clipping of audio signals that exceed T by more than 1 or 2 dBs results in unacceptable distortions for high quality audio applications.

Peak-limiting includes: Peak-limiting a signal S(t) to a threshold T is done by attenuating the signal S(t), locally around points where its absolute value exceeds a threshold T, such that the absolute value of the resulting signal will not exceed T. Clipping is one way to implement peak-limiting, but in general peak limiting refers to more sophisticated processing applying smooth attenuation, that significantly reduces distortions compared with simple clipping.

Peak limiter includes: a signal processing device or algorithm that applies peak-limiting to its input signal, to provide a peak limited output signal.

Smooth attenuation includes: a common implementation of a peak limiter is to compute a smooth attenuation signal, and multiply it by the input signal to produce the peak limited output. In general, the smooth attenuation signal will be <1.0 around locations where the input signal exceeds the threshold. Smoother attenuation signals will keep being <1.0 further away from the locations where the input signal exceeds the threshold.

Audio Track includes: reference to mono audio signal, but also to the more general case of multi-channels audio track. A multi-channels audio track may be a stereo track, consisting of two channels, or a surround track, consisting of 5.1 or more channels.

Mixing includes: Summing of multiple audio signals together.

Multi Channels Mixing includes: mixing of multiple audio tracks, where each track consists of multiple channels and respective channels from each track are mixed to one respective channel of the output. Multi channels mixing differs from independent multiple monophonic mixers in that the amplitude relations between channels of the same input track should be maintained also in the output mix.

Down Mixing includes: down mixing is common when there is a need to play back multi-channels audio such as stereo or surround, trough a system with fewer output channels. For example, playing 5.1 surround recording through a stereo system. In the context of this invention reference is made to the fact that information from several channels has to be mixed in order to form the fewer output channels, and thus there is a risk of overflow in the output.

Frequency Bands Splitting includes: splitting the audio signal into multiple frequency bands, process them and mix back to form the output signal.

SUMMARY OF THE INVENTION

Note that in accordance with the invention audio signals are mixed and subjected to peak limiting. An audio signal can be, for instance: track, channel, or band.

The present invention presents a new approach for peak-limiting the resulted mix of multiple audio tracks. By one aspect of the present invention, a smooth attenuation signal is applied to each of multiple audio tracks before mixing them, such that the resulted mixed signal will be peak limited. By one embodiment, smooth attenuation signals are computed according to the audio tracks before the mix, and the predictions of said smooth attenuation signals.

By using the technique suggested by the present invention, many more degrees of freedom are available compared with prior art technologies, to decide what attenuation to apply to each of the tracks, while still achieving peak limiting. According to an embodiment of the present invention, it is possible to formulate the problem of computing the attenuation signals, as a constrained optimization problem. The additional degrees of freedom allow for different optimization goals and constraints to be set, according to the needs of different application.

In the following description practical needs for music production will be presented, and it will be demonstrated how these needs can be answered according to various embodiments of the invention. Those versed in the art will readily appreciate that the invention is not bound by the specific application of music production.

Consider, for instance, the case of modern music production. In a modern music production, the final audio is a mix of multiple audio tracks, each of a different instrument. Prior art peak-limiting techniques apply peak limiting to the resulted signal after mixing, and possibly also to each individual track before the mixing, in isolation. By doing so, significant information of the relations between the tracks while referring to the mixed result is ignored, this leads to sub optimal results compared with what can be achieved according to the present invention.

Consider also the case of radio broadcasting, or audio mastering. In both these cases the original tracks before mixing are not available, and only the final mixed result is available. Some prior art techniques apply peak limiting directly to the final mixed signal, and are thus subjected to inter-modulation distortions. Prior art multi-bands peak limiters can reduce such inter-modulation distortions by splitting the final mixed signal into multiple frequency bands, peak limiting each band separately, and possibly apply a final wide-band peak limiter to the final mixed signal. Such prior art multi-bands peak limiters perform peak limiting on each band in isolation before the summation, while ignoring information that can be derived by simultaneously relating to all the bands before the mix, their respective control signals, and the result of the mixed signal.

According to certain embodiments of the present invention, in both the above examples, more optimal results can be achieved by relating to all the information available at once, taking in account the relations between the audio tracks what each of them contributes to the final mix, the predicted smooth attenuation for each track, as well as the predicted final mix.

A non-limiting example of an improvement possible according to the present invention is reducing and controlling inter-modulation distortions between the multiple audio tracks. Another non-limiting example of an improvement possible according to the present invention is reducing the perceived amount of overall modifications to the audio signal, for the same amount of limiting.

The present invention provides a method for processing audio signal comprising:
(a) receiving a plurality of audio signals and calculating signal levels thereof;
(b) calculating smooth attenuation signal for each one of said input audio signals; said smooth attenuation signals are calculated according to said signal levels and smoothing criteria, such that the mixing of signals that include said input audio signals multiplied by their respective smooth attenuation signals is peak limited by a given threshold level.

The present invention further provides a method for calculating a control signal for a peak-limiting mixer, comprising:
(a) receiving a plurality of audio signals and calculating signal levels thereof;
(b) calculating attenuation signals for each one of said input audio signals;
(c) calculating a target function for each one of said attenuation signals and providing constrains for the resulted mixing of signals that include said input audio signals multiplied by their attenuation signals to be peak limited, and for the attenuation signals to be smooth.

Still further the present invention provides a method for calculating a control signal for peak-limiting mixer, comprising:
(a) receiving a plurality of audio signals and calculating signal levels thereof;
(b) calculating attenuation signals for each one of said input audio signals;
(c) calculating a target function for each one of said attenuation signals and providing constrains for the resulted mixing of signals that include said input audio signals multiplied by their attenuation signals to be peak limited.

Yet still further the present invention provides a method for processing audio signal, comprising:
(a) receiving a plurality of digital audio signals and calculating signal levels thereof;
(b) calculating attenuation signal for each one of said input audio signals such that the mixing of signals that include said input audio signals multiplied by their attenuation signals is peak limited by a given threshold level, and controlling a desired level of relative attenuation difference between signals.

The present invention further provides a method for processing audio signal, comprising:
(a) receiving a plurality of digital audio signals and calculating signal levels thereof;
(b) calculating attenuation signal for each one of said input audio signals such that the mixing of signals that include said input audio signals multiplied by their attenuation signals is peak limited by a given threshold level, and wherein each signal includes at least two channels and further controlling a desired level of relative attenuation difference between channels or group of channels for the same signal.

Yet still further the present invention provides a program storage device readable by machine, tangibly embodying a program of instructions executable by the machine to perform method steps for processing audio signal, comprising:
(a) receiving a plurality of digital audio signals and calculating signal levels thereof;
(b) calculating smooth attenuation signal for each one of said input audio signals; said smooth attenuation signals are calculated according to said signal levels and smoothing criteria, such that the mixing of signals that include said input audio signals multiplied by their respective smooth attenuation signals is peak limited by a given threshold level.

By a further aspect the present invention provides a program storage device readable by machine, tangibly embodying a program of instructions executable by the machine to perform method steps for calculating a control signal for a peak-limiting mixer, comprising:
(a) receiving a plurality of digital audio signals and calculating signal levels thereof;
(b) calculating attenuation signals for each one of said input audio signals;
(c) calculating a target function for each one of said attenuation signals and providing constrains for the resulted mixing of signals that include said input audio signals multiplied by their attenuation signals to be peak limited.

Still further the present invention provides a program storage device readable by machine, tangibly embodying a program of instructions executable by the machine to perform method steps for calculating a control signal for a peak-limiting mixer, comprising:
(a) receiving a plurality of digital audio signals and calculating signal levels thereof;
(b) calculating attenuation signals for each one of said input audio signals;
(c) calculating a target function for each one of said attenuation signals and providing constrains for the resulted mixing of signals that include said input audio signals multiplied by their attenuation signals to be peak limited.

Yet still further the present invention provides a program storage device readable by machine, tangibly embodying a program of instructions executable by the machine to perform method steps for processing audio signal, comprising:
(a) receiving a plurality of digital audio signals and calculating signal levels thereof;
(b) calculating attenuation signal for each one of said input audio signals such that the mixing of signals that include said input audio signals multiplied by their attenuation signals is peak limited by a given threshold level, and controlling a desired level of relative attenuation difference between signals.

The present invention still further provides a program storage device readable by machine, tangibly embodying a program of instructions executable by the machine to perform method steps for processing audio signal, comprising:

(a) receiving a plurality of digital audio signals and calculating signal levels thereof;

(b) calculating attenuation signal for each one of said input audio signals such that the mixing of signals that include said input audio signals multiplied by their attenuation signals is peak limited by a given threshold level, and wherein each signal includes at least two channels and further controlling a desired level of relative attenuation difference between channels or group of channels for the same signal.

BRIEF DESCRIPTION OF THE DRAWINGS

For a better understanding, the invention will now be described, by way of example only, with reference to the accompanying drawings, in which:

FIG. 1.A-C. illustrate prior art peak-limited versus clipped signal;

DESCRIPTION OF PREFERRED EMBODIMENTS

Note that examples below refer mainly to multi track signals. Those versed in the art will readily appreciate that tracks are a non limiting example of signal and the invention is not bound by this example.

The principles and operation of a peak-limiting mixer for multiple audio tracks according to non limiting embodiments of the present invention may be understood with reference to the drawings and the accompanying description.

Peak-Limiting Mixer

Figure 2:
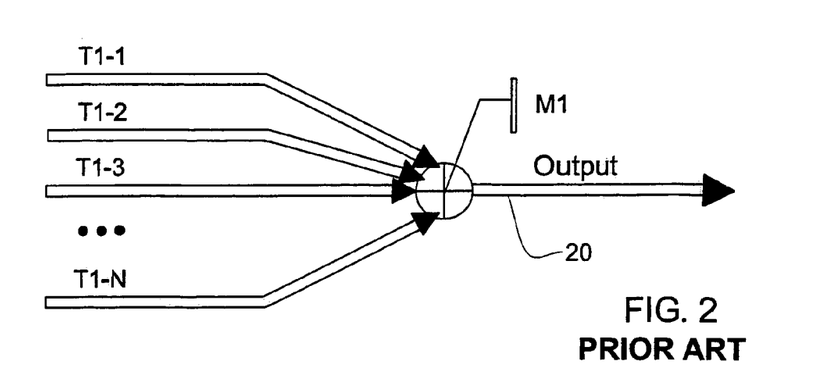
FIG. 2 illustrates schematically a multi-track mixer, in accordance with the prior art.

Mixing of multiple audio tracks occurs in many applications of audio signal processing, one example illustrated in FIG. 2, is a multi track mixer according to the prior art where the distinct tracks T1-1 to T1-N are mixed at mixer M-1, giving rise to mixed output signal 20.

Figure 3:
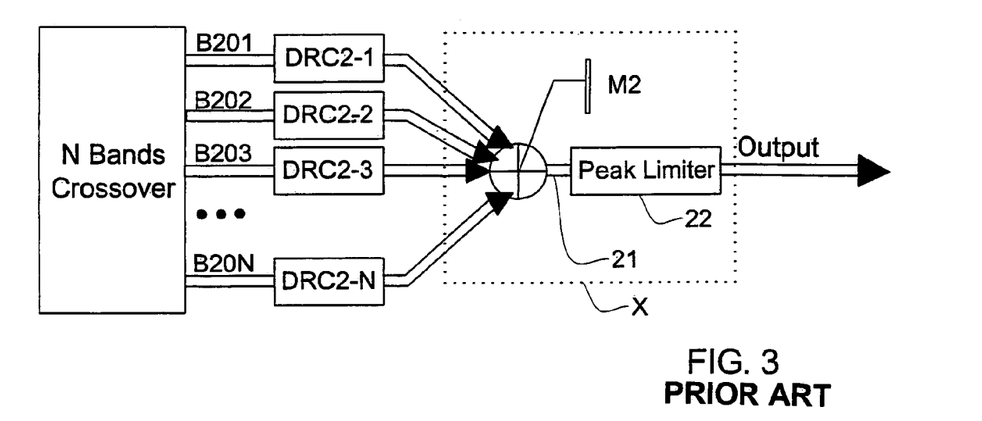
FIG. 3 illustrates schematically a multi bands dynamics processor, in accordance with the prior art.

Turning now to FIG. 3, there is shown a multi bands dynamics processor. As shown a signal is split into multiple bands B201 to B20N. Each distinct band signal is fed to respective dynamic range control (DRC2) module and is subjected to mixing (M2) giving rise to a mixed signal 21 that is fed to peak limiting module 22 FIG. 1. The latter delivers an output signal which does not exceed the threshold controlled by peak limiter module 22.

Figure 4:
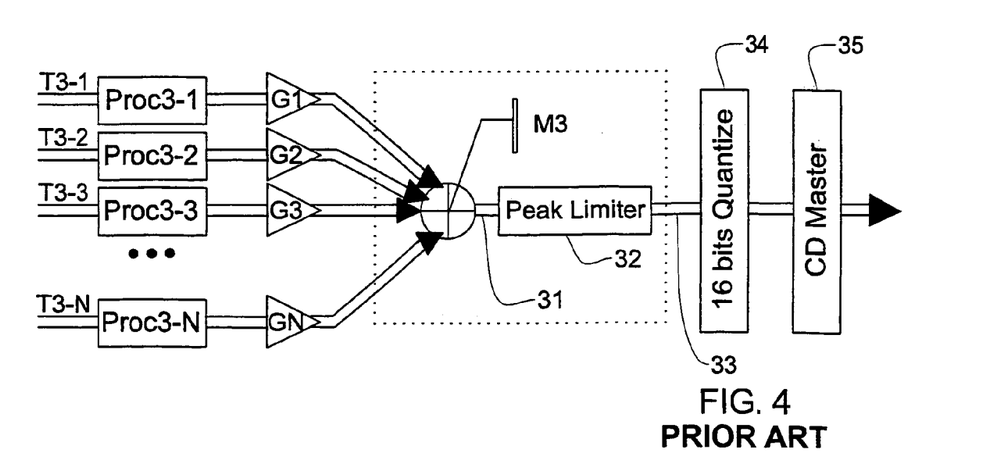
FIG. 4 illustrates a typical signal-processing path from mixing to the final Compact Disk distribution, in accordance with the prior art.
Figure 5:
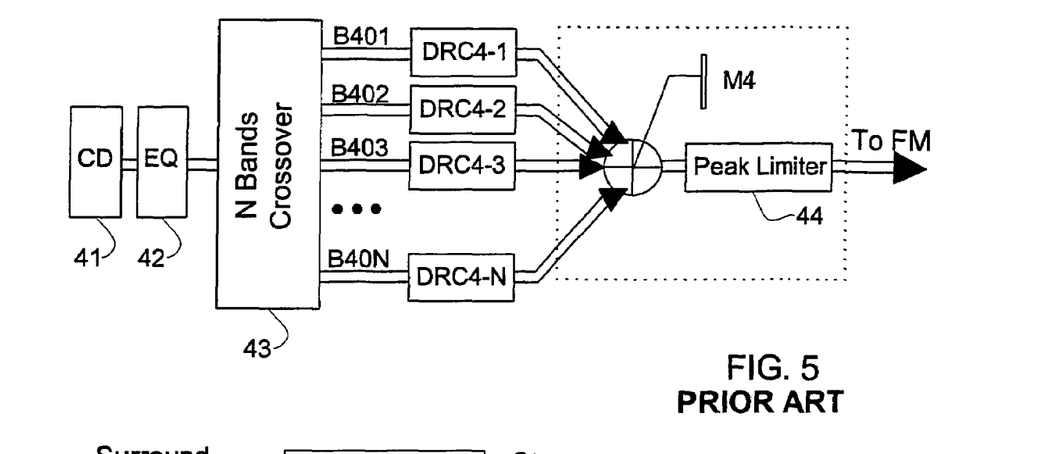
FIG. 5 illustrates a typical signal-processing path from an existing CD to FM radio broadcast, in accordance with the prior art.

Peak limiting is used in many applications. For instance, FIG. 4 illustrates a typical signal-processing path from mixing to the final Compact Disk CD distribution in accordance with the prior art. Thus, distinct tracks T3-1, T3-2 to T3-N are fed to respective processor modules Proc3-1, Proc-2 to Proc3-N which process in a known per se manner the input track signals and feed the processed signal to amplifier (Gi), and thereafter to Mixer M3. The mixed signal 31 is fed to Peak limiter module 32, for delivering a signal 33 which does not exceed the threshold controlled by peak limiter module 32). The signal 33 is fed to 16 bit Quantize module 34, giving rise to CD Master output signal 35. Another exemplary application is shown in FIG. 5 illustrating a typical signal-processing path from an existing CD to FM radio broadcast. As shown a CD signal input 41 is fed to Equalizer module 42 that that is fed to N Bands Crossover module 43 for splitting the signal to distinct bands B401 to B40N and then fed to respective DRC4-1 to DRC4-N modules and therefrom to Mixer module M4 and to Peak Limiter module 44 giving rise to output FM signal.

Figures 6, 7:
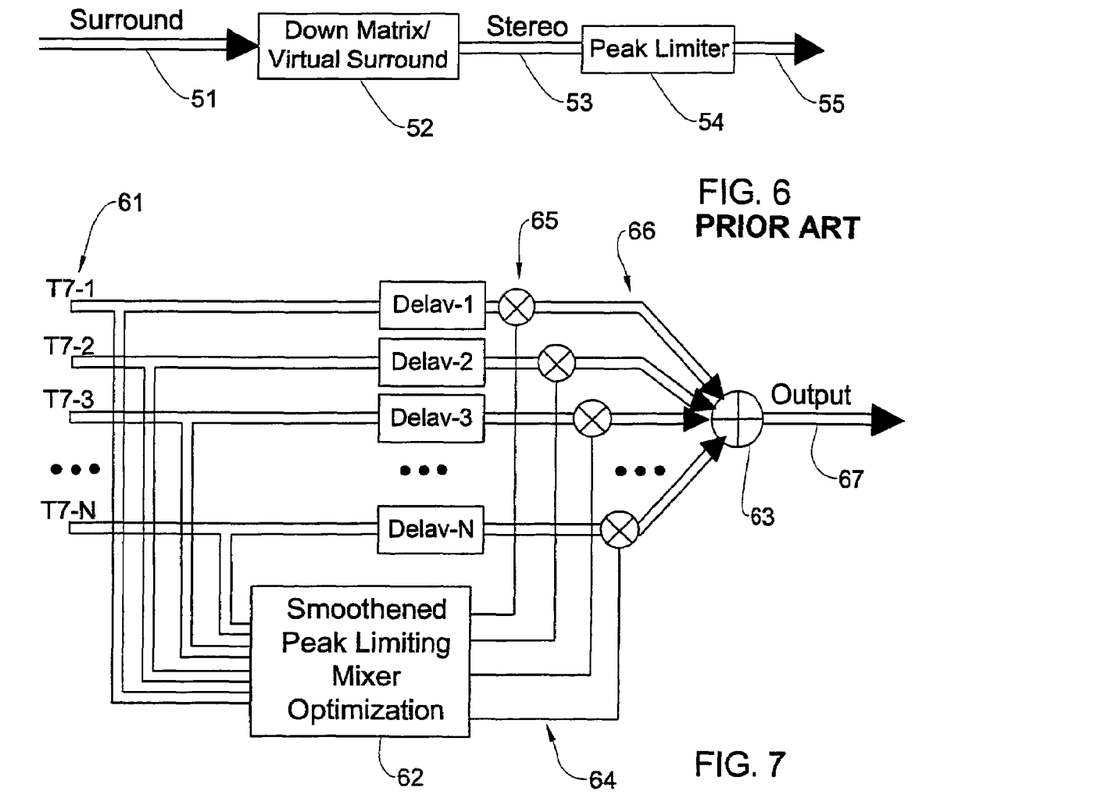
FIG. 6 illustrates a generalized block diagram of down matrixing of 5.1 surround to stereo, in accordance with the prior art.
FIG. 7 illustrates a generalized block diagram of a peak limiting mixer according to an embodiment of the invention, where the optimization and smoothing are performed as one integral step.

FIG. 6 illustrates yet another example that utilizes peak limiter. Thus, a 5.1 surround signal 51 is fed to Down Matrix Virtual Surround 52 giving rise to a stereo signal 53 that is fed to peak limiter signal 54, which delivers an output signal 55. It can be seen that all the above examples share the common stages of mixing followed by peak-limiting. It can also be seen that in the above prior art examples, the input to the peak limiter is either the individual tracks before mixing, or the mixed signal.

Having illustrated few examples which utilizes mixing and peak limiting in accordance with the prior art, there follows a description with reference to certain embodiments of the invention.

Thus, a peak-limiting mixer according to certain embodiments of the present invention is designed for applications where multiple audio tracks needs to be mixed, while the final output should be peak limited. According to certain embodiments of the present invention, more optimal results compared with prior art can be achieved by analyzing in conjunction all the individual tracks taking into account smooth signal criteria whilst assuring that the mixed signal will not exceed a certain threshold. For a better understanding of the foregoing, attention is directed to FIG. 7 illustrating a generalized block diagram of a system in accordance with an embodiment of the invention. As shown input tracks 61 are fed into smooth attenuation module 62 which considers the input signal's level, the smooth signal criteria and the constraint that the mixed signal (after being summed in 63) will not exceed the threshold T, in order to derive the smooth attenuation signal 64, which is applied to the input signals (in 65) to give rise to attenuated input signals 66 that are later mixed in 63 to give rise to output signals 67. By one embodiment the smooth attenuation signals of the respective tracks is determined based on the their respective predicted smooth attenuation signals before mixing them, in order to derive the new smooth attenuation signals. In other words by this embodiment the smooth signal criteria that is considered by module 62 is the predicted smooth attenuation signal, which in conjunction with the input signal levels (61) and the constraint that the output signal should be peak limited to T, determines the smooth attenuation signals 64. Note that the delays are optional to allow look-ahead smoothing; Here each input track may consist of multiple channels (illustrated by the think lines), and al channels within the same track are linked, and so are multiplied by the same control signal (illustrated by the single control signal per track). Note incidentally, that regardless of the embodiment under question, the calculations of the smooth signal (taking into account the input signals) can be performed in a centralized manner (delivering the smooth signal for each track) or in an autonomous fashion for each track, i.e. for each track a separate calculation is performed taking into account the input signals and giving rise to the smooth signal for the respective track.

This architecture allows optimizing the control signals according to additional desired goals, while maintaining the primary goal of the final mix signal to be peak limited. Non-limiting examples for such additional desired goals are minimization of inter modulations between the audio tracks, minimizing the perceived deviation from the non peak limited signal, designating some tracks to be less attenuated than others, and more.

Peak-Limiting Mixer as a Constrained Optimization Problem

According to certain embodiments of the invention, the problem of computing the control signal for a peak-limiting mixer can be viewed as a constrained optimization problem, where a certain target function is optimized, while the constrains are for the resulted mixed signal to be peak limited, and for the attenuation signals to be smooth. Before describing some examples for target functions that lead to desired audible benefits, certain issues related to smooth attenuation signal are discussed.

Smooth Attenuation Signal Consideration

Constrains related to attenuation signal smoothing, have the effect of forcing more attenuation for certain tracks, compared with a solution ignoring smoothing. A simple example is the case of a signal clipper versus a peak limiter, where in general the peak limiter applies more attenuation than a clipper does in order to achieve a smooth attenuation signal. This is illustrated in FIG. 1C, where, as shown, the signal is clipped 11 to a given level. If, however, smoothing is used (see smoothened signal 12) additional attenuation is applied (see curved signal portions 13 and 14 which drop below the level of the clipped signal 11). Now, in accordance with certain embodiments of the invention, when smooth signal criteria is taken into consideration this surplus attenuation can be used to allow reduced attenuation level that is applied to other input signal(s) such that the overall mixed signal will not exceed the peak limited value T.

In other words it follows that in order to optimize the smooth attenuation signal; its own effect should be taken in account. For example, if a track is already attenuated due to smoothing (such as the one illustrated in FIG. 1C), other tracks having the same polarity may require less attenuation, and tracks with opposite polarity may require more attenuation in order to achieve peak-limiting.

By one embodiment the smooth signal criteria is realized by predicting the smooth attenuation signals in order to compute the new optimal attenuation. There follows now two non limiting embodiments for realizing the smooth attenuation prediction: Worst case prediction of the smooth attenuation signal and, Limit and smooth method of attenuation signal smoothing, as follows:

Worst Case Prediction of the Smooth Attenuation Signal:

Depending on the method of attenuation signal smoothing, it may not be possible, or practical to predict exactly the smoothed attenuation signals. In such cases a worst-case prediction should be taken, such that worst-case prediction errors can never cause exceeding of the threshold, rather only excessive attenuation. This is of course a compromise between the method of attenuation signal smoothing, and optimal peak limiting. It should be noted that the worst-case prediction of attenuation signal is different for a track with the same polarity of the final mixed output, and for a track with the opposite polarity. For a track with the same polarity, the worst-case prediction is the minimum attenuation possible. For a track with the opposite polarity, the worst-case prediction is the maximum attenuation possible.

Limit and Smooth Method of Attenuation Signal Smoothing

In the following discussion the exact method of deriving the smooth attenuation signals, may affect the exact implementation and formulation of the optimization problem. Without limiting the generality of the invention reference is made here to one possible method of deriving the smooth attenuation signal, referred to here as 'limit and smooth', and formulate the optimization according to this method. The limit and smooth per se method is common in prior art peak limiters, and consists of first computing a non smoothed attenuation signal, and then smoothing it to derive the smoothed attenuation signal. The non smoothed attenuation signal is computed such that optimal peak-limiting is achieved for every time interval (taking into account the smooth signal criteria, which, by one embodiment, concerns predicting the smooth signal). Thereafter smoothing is applied however since its effect has already been taken into account it is assured that the smoothed attenuation signal peak-limiting is achieved with the smoothed attenuation signal. In other words, whilst the smoothing is actually applied later (after the mixing) its effect has been taken into account when the attenuation is applied to the input signal.

Figure 8:
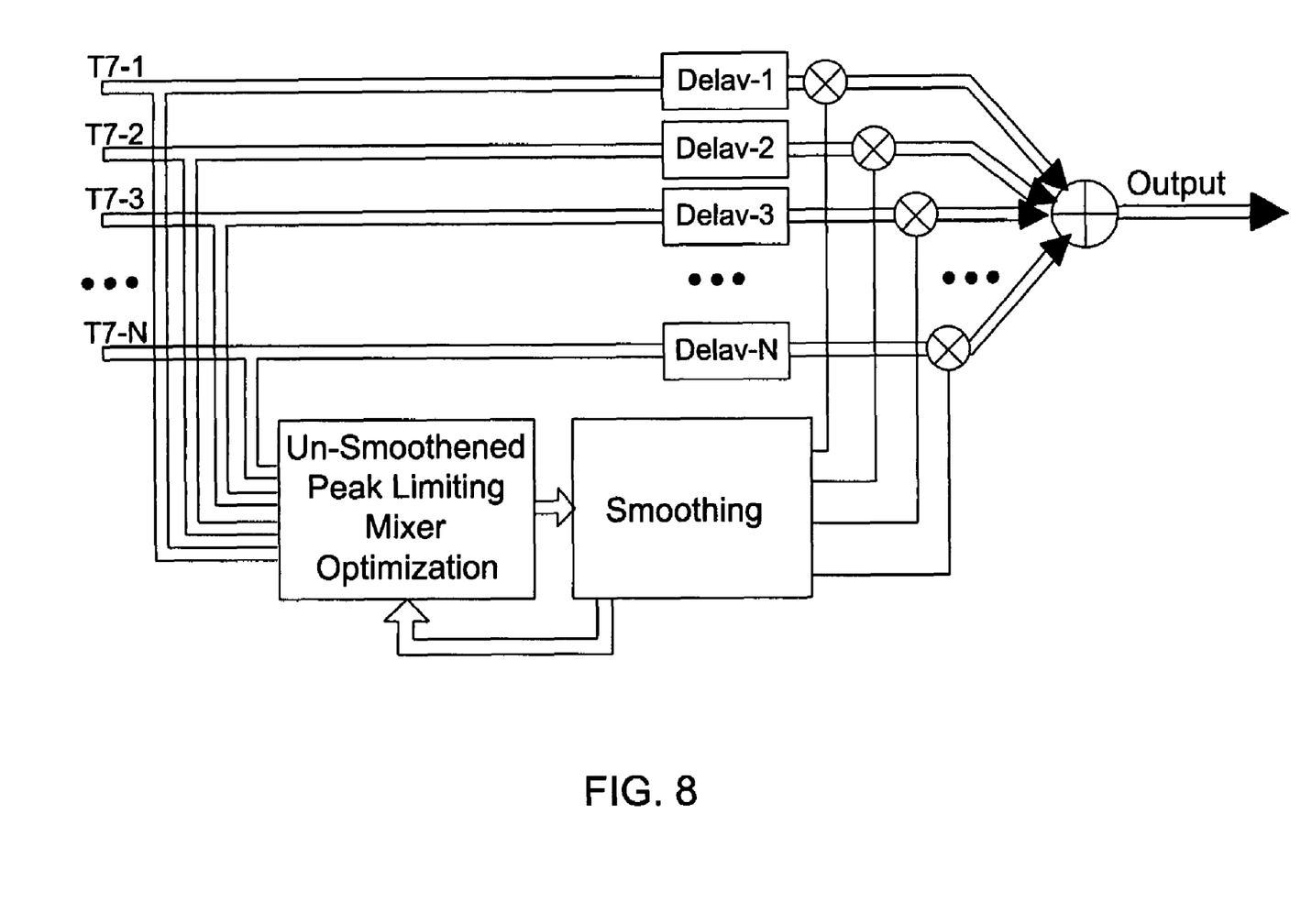
FIG. 8 illustrates a generalized block diagram of a peak limiting mixer according to another embodiment of the invention, where the optimization and smoothing are performed as two separate steps.

Attention is now drawn to FIG. 8 illustrating a generalized block diagram of a peak limiting mixer according to another embodiment of the invention, where the optimization and smoothing are performed as two separate steps, and where optimization relates to the results of smoothing.

Having discussed few non limiting embodiments of utilizing the smooth signal criteria for peak limiting (in the specified "worst case" and "smooth and limit" examples), there follows a discussion in which demonstrates the peak-limiting mixer formulated as a constrained optimization problem. Thus, in the following discussion practical examples will be given to demonstrate how different target functions and the related constrains (forming together an optimization problem), may be formulated according to specific needs of different applications, relevant in the field of music production and distribution (for achieving peak limited mixed signal utilizing smooth signal criteria. As will be further shown below some of the specified target functions can also serve for minimizing inter-modulations effects.

Target Functions for Minimizing Inter Modulations

Consider a case where two audio tracks are mixed, and where the first track has values 12 dB higher than the other on the average. A prior art wide band peak limiter operating on the mixed signal will attenuate both tracks equally, even though the peak value of the mixed signal is dominated by the peak value of the first track. Thus, in the resulted peak limited mixed signal, the second track will be modulated according to the first track. Specifically consider that the peak limiter threshold is 0.625, the instantaneous value of the first track at some time is 1.0, and at the same time the value of the second track is 0.25. A prior art peak limiter operating on the mixed signal, will have to apply attenuation <0.5 such that: $0.625=0.5*(1.0+0.25)$. Thus here the first track modulates the second.

Such inter modulations can be minimized according to the principles of certain embodiments of the present invention by applying more attenuation to the higher track, and attenuating the lower track only as much as needed such that the resulting mix will be peak limited. For the above example, attenuating the first track slightly more, say by 0.4, will allow an attenuation of only 0.9 to the second track, while still not exceeding the threshold, such that:

0.625=0.4*1.0+0.9*0.25.

Several target functions can be suggested that will exactly determine how to distribute the attenuation between the different tracks in order to minimize inter modulations. Few examples are described below.

Monophonic Un-weighted Maximum Gain Target Function in Accordance with Certain Embodiments of the Invention:

One possible example for a target function for optimizing the attenuation per each track is maximizing the product of the attenuations applied across the tracks. This target function has the effect of decreasing inter modulations because it leads to attenuations that are proportional to the level of each track. Since the human's ear sensitivity to signal level is logarithmic, this target function also leads to minimizing the perceived deviation of the peak limited mixed signal from the corresponding non peak limited signal.

The un-weighted maximum gain optimization problem can be formulated as: p Given instantaneous values of N signals S(n) for n=0 ... N-1;

and predictions of N smooth attenuation values $0<PA(n)<=1$;

find N new control values A(n), in the range $0<A(n)<=PA(n)$, such that:

$$\left| \sum_{n=0}^{N-1} (S(n) * A(n)) \right| <= \text{Threshold}$$

While $$\prod_{n=0}^{N-1} A(n)$$

is maximized.

Note that here; the constraint $A(n)<=PA(n)$ is where the effect of attenuation signals smoothing is taken to account.

This optimization problem can be solved using any known per se optimization technique; specifically it has a closed solution based on the method of Lagrange Multipliers. The general solution states that the attenuation should be proportional to $1/S(n)$.

Monophonic Weighted Maximum Gain Target Function According to another Embodiment of the Invention:

The un-weighted maximum gain algorithm optimizes the attenuations while giving equal weights for all the tracks. Since in practice not all tracks in an audio mix are equally important, it is desirable be able to assign desired weights for at least one track. Such weights will provide for attenuating a certain track less, on expense of other tracks, and vice versa.

Given instantaneous values of N signals S(n) for n=0 ... N-1;

and N weighting factors $0<W(n)<1$;

and predictions of N smooth attenuation values $0<PA(n)<=1$;

find N new control values A(n), in the range $0<A(n)<=PA(n)$, such that:

$$\left| \sum_{n=0}^{N-1} (S(n) * A(n)) \right| <= \text{Threshold}$$

While $$\prod_{n=0}^{N-1} A(n)^{W(n)}$$

is maximized.

Also this optimization problem can be solved using method of Lagrange Multipliers or any other standard optimization technique. The general solution states that the attenuation should be proportional to $W(n)/S(n)$.

Note that in the latter examples the smooth signal criteria was realized by predicting the smooth signal (see $0<A(n)<PA(n)$ above) ). As mentioned above, the invention is not bound by this specific example of utilizing the smooth signal criteria. Thus, by way of another non limiting example the smooth signal criteria can utilize condition on the spectrum of the smooth signal. Accordingly, reverting now to the formulation of the optimization problem, another target function can be formulated to reflect the smooth signal spectrum condition.

By one example the target function concerns adding a cost term related to the smooth attenuation signal, as follows:

In the previous examples relating to attenuation signal, smoothing was implemented through predicting the smooth attenuation signal and adding it into the constraints of the optimization problem; specifically trough the constrain $0<A(n)<=PA(n)$. Another way to implement the smoothing by adding to the target function another cost term, related to the smoothing. Such a cost term can be related to the spectrum of the smooth attenuation signal, such that high cost is associated with high frequency content in the smooth attenuation signal. Such a cost term can be based on psychoacoustic considerations. More specifically such a cost term can be designed to be related to the amount of perceived distortion in the resulted peak limited signal.

It should be noted that the specified examples of applying conditions on the spectrum of the smooth attenuation signal are another non limiting examples of using smooth signal criteria when calculating the desired attenuations which lead to peak limiting (after mixing) to a pre-defined threshold.

Tracks Separation Control According to another Embodiment of the Invention:

Note that in certain operational scenarios application of the weighted or un-weighted maximum gain algorithms may result in different attenuations that are applied to each track, and consequently the balance between the tracks changes. In normal peak-limiting situations, the peak-limiting threshold is set such that signal peaks exceeds it only occasionally for a short duration, and so the change in tracks balance is mostly unnoticeable. This is normally the case for high quality music production, where the peak-limiting threshold is exceeded only for occasionally and the maximum attenuation reached is about −6dB. On the other hand, for very competitive applications such as radio broadcasting, high RMS signal level is a competitive advantage and thus much more aggressive peak-limiting thresholds are used. As a result the signal exceeds the limiting threshold most of the time, and the attenuations for the different tracks can differ significantly for long durations of time, thus possibly changing the balance between tracks to an undesirable extent. It is thus desirable to control the amount of relative attenuation difference possible between tracks. Such control can be achieved in several ways. Intuitively, (and for illustration purposes only) one possible manner of presenting such a requirement would be to comply with the following constraint: Max (A(n))/Min (A(n))<R, where Max (A(n) stands for the maximal attenuation applied to a given input track, Min (A(n)) stands for the minimal attenuation applied to another input track and R stands for the maximal allowed relative difference between the maximal and minimal attenuation levels.

One possible way of applying the Tracks Separation Control is by adding another constraint to the optimization algorithm where relative attenuation differences between tracks can not exceed a certain threshold. Another possible way is by reducing the separation between tracks.

The description below illustrates two non limiting examples of posing constraints for controlling the relative attenuation difference between tracks, i.e. by using Cross feed between tracks and reduced filters Q techniques, as follows:

Reducing Separation through Cross feed between tracks

By cross feeding controlled amounts of each track into the other tracks before applying the peak limiter, continuous control of tracks separation can be achieved. One possible way to implement a Cross Feed Separation control follows:

Define a separation parameter SEP in the range $0.0<SEP<1.0$.

Define the signal SUM=ΣS(n)/N Compute a modified signal MS(n) for each input track as:

MS(n)=SEP*S(n)+(1.0−SEP)*SUM;

Note that when SEP=1.0 the modified track signal MS(n), is equal to S(n) and full separation is achieved, and for SEP=0.0 all of the modified track signals SM(n) equal to SUM and no separation is achieved.

Further note that for any $0<=SEP<=1$: ΣS(n)=ΣMS(n), by definition.

Applying the same above optimization algorithms to MS(n) instead of S(n) will provide for controlling separation.

Reducing Separation through Reduced Filters Q

In the case where the multiple tracks are a result of splitting an audio signal into several frequency bands with a cross over filter, a separation control can be implemented by controlling the Q of the cross over filter. Lowering the Q will result in less separation between the frequency bands.

The invention is not bound by the use of these specific examples.

Linked Multi Channels Case

Almost any modern audio production has multi channels audio, ranging from stereo to surround 5.1, 7.1, 10.2 and more. In multi channels audio, the relative levels and phase between the channels encode the spatial information. Thus when peak limiting multi channels audio tracks, it is important to maintain the relative levels between channels, or groups of channels of the same audio track, other wise the spatial audio image will be distorted. This is achieved in prior art peak limiters by implementing linked processing. In linked processing a common attenuation is applied to a predefined group of channels of the same audio track, so as to maintain their relative levels. In prior art linked peak limiters; the common attenuation is computed by applying the peak-limiting algorithm to the maximum absolute value of the group of channels, or a similar method. Examples of prior art linked peak limiters are products like Waves-L1, L2, and L360. L1 and L2 are stereo linked peak limiters, where both stereo channels receive exactly the same attenuation. L360 is a 5.1 linked peak limiter, where it is possible to select which groups of channels should be linked, according to the production needs. Possible choices in the L360 are:

linking all 5 channels, linking the front left and right channels as one group, and the rare left and right channels as a second group, leaving the center channel unlinked.

linking the front left and right and center channels as one group, and the rare left and right channels as a second group.

linking all front and back channels except the center.

For a multi channels peak-limiting mixer, where each of the input tracks consists of multiple channels, it is also important to maintain the relative levels between groups of channels of the same input track. As will be explained, in the case of multi channels peak-limiting mixer the optimal solution is more complex, and a simple worst case solution such as for multi channels linked limiters is sub optimal.

There follows few non limiting example for maintaining the relative levels between channels, e.g. by using the Worst case linking and optimized linking, as follows:

Worst Case Linking

A worst case solution would be to compute the optimal attenuation independently for corresponding channels across all tracks, and than take the minimum attenuation across channels of the same group. This is similar to the methods used in prior art linked peak limiters. Although in prior art linked peak limiters this solution is optimal, for the case of a linked-multi channels peak-limiting mixer this will mostly lead to a sub optimal solution where output channels will be mostly bellow the threshold. Note that the sub-optimal result is obtained since when forcing attenuation on a channel due to linking to another channel of the same track, it may be that attenuation of other tracks may be relieved.

Optimized Stereo Link

To simplify the explanation reference is made at first to the case of a stereo peak-limiting mixer. Formulating the problem of linked-stereo peak-limiting mixer as an optimization problem follows:

Given instantaneous values of N left-channel signals L(n) for n=0 . . . N−1;

and instantaneous values of N right-channel signals R(n) for n=0 . . . N−1;

and predictions of N smooth attenuation values 0<PA(n) <=1;

find N new control values A(n), in the range 0<A(n)<=PA (n), such that:

$$\left|\sum_{n=0}^{N-1}(L(n)*A(n))\right| <= \text{Threshold, and;} \quad \text{a)}$$

$$\left|\sum_{n=0}^{N-1}(R(n)*A(n))\right| <= \text{Threshold;} \quad \text{b)}$$

While $$\prod_{n=0}^{N-1} A(n)$$

is maximized.

This optimization problem can also be solved using Lagrange Multipliers method. It can be shown that the optimal solution of the stereo linked is achieved by solving the mono case for input tracks S(n) of the form S(n)=λ*SignL*L(n)+(1-λ)*SignR*R(n) for some weighting coefficient 0<=λ<=1, and where SignL and SignR are 1 or −1.

The value of λ that yields the optimal linked stereo solution is unknown, and should be found using a numerical search method.

The search is completed when λ is found for which at least one of the above constrains a) b), equals the Threshold. Traditional search methods may be used, for example binary search yields good results, converging after about 10 iterations, depending on the degree of precision required for the solution.

Weighted Optimized Stereo Link

As shown above the optimal solution of optimized stereo link can be reduced to iteratively solving the monophonic un-weighted maximum gain target function optimization problem. By using the same method and solving the monophonic weighted maximum gain target function the weighted optimization problem for stereo case can be solved.

Linked Multi Channels Case:

The generalization of the linked stereo case to the linked multi-channels case can be formulated as the following optimization problem:

Given instantaneous values of N tracks each consisting of M channels S(n,m) for n=0 ... N-1, m=0 ... M-1; and predictions of N smooth attenuation values 0<PA(n)<=1;

find N new control values A(n), in the range 0<A(n)<=PA(n), such that:

for any $$m = 0 \ldots M - 1, \left| \sum_{n=0}^{N-1} (S(n, m) * A(n)) \right| <= \text{Threshold, and;}$$

While $$\prod_{n=0}^{N-1} A(n)$$

is maximized.

This optimization problem can also be solved using Lagrange Multipliers method. It can be shown that the optimal solution of the multi channels linked case is achieved by solving the mono case for input tracks S(n) of the form $$S(n) = \sum_{m}^{M-1} \lambda_m * S(n, m)$$

for weighting coefficient $-1<=\lambda_m<=1$, and $$1 = \sum_{m=0}^{M-1} |\lambda_m|.$$

The values of $\lambda_m$ that yields the optimal linked stereo solution is unknown, and should be found using a numerical search method.

Sub Group Linked Multi Channels Case:

As mentioned above, in some applications of multi-channels audio it is desirable to link only between sub-groups of channels, and not all the channels. For example in the case of 5.1 channels, channels may be divided into several groups configurations as follows, where linking is required within each group, but not between the groups:

1. (LeftFront,RightFront,Center,LeftSurround,RightSurround,Sub), that is all channels in one group
2. (LeftFront,RightFront,Center,LeftSurround,RightSurround), (Sub),
3. (LeftFront,RightFront,Center), (LeftSurround,RightSurround), (Sub),
4. (LeftFront,RightFront), (Center), (LeftSurround,RightSurround), (Sub),
5. (LeftFront), (RightFront), (Center), (LeftSurround), (RightSurround), (Sub), In each of these cases the optimization problem can be solved per each group independently, since there are no dependencies between the groups. This will result in one optimization problem of 6 linked channels in the first example above, and 6 independent monophonic optimization problems for the last example above. According to the same principle other cases of Sub group linked multi channels case.

Linked Down Mix Case

When down mixing an audio signal with large number of channels down to a smaller number of channels, such as in the case of down mixing a 5.1 signal into 2.0 (stereo) or 2.1 (stereo+subwoofer), also different channel linking schemes may be needed. One example of a 5.1 to 2.0 down mix situation is to mix the LeftFront, LeftSurround, 1/sqrt(2)*Center and 1/sqrt(2)* Sub into the StereoLeft channel, and similarly to the StereoRight channel. Mathematically this can be termed as:

StereoLeft=LeftFront+LeftSurround+1/sqrt(2) * Center+1/sqrt(2) * Sub

StereoRight=RightFront+RightSurround+1/sqrt(2)*Center+1/sqrt(2)* Sub

If the sub group linking scheme 4 is used above, then the above down-mix can be viewed as mixing 4 independent stereo audio signals, where the channels of each stereo signal are linked. Thus this case can be solved trough the Optimized Stereo Linked or Weighted Optimized Stereo Linked cases described above If the sub group linking scheme 3 above is used, then first the term 1/sqrt(2)*Center should be added to the LeftFront and RightFront correspondingly, and then 3 independent stereo audio signals are mixed, where the channels of each stereo signal are linked. And this case can be solved trough the Optimized Stereo Linked or Weighted Optimized Stereo Linked cases.

Analog Domain Mixing Case:

In some applications it is advantageous to perform the mixing of audio signals in the analog domain. For example many sound engineers often prefer the results of mixing on an analog mixing bus rather than a digital mixing bus. To implement this in a digital audio workstation environment, the audio signals are converted to the analog domain before mixing, and the mixing is then performed in the analog domain.

According to an aspect of the invention, it is possible to implement a peak limiting mixer where the mixing stage is performed in the analog domain and thus benefits from any advantages of analog domain mixing.

Figure 9:
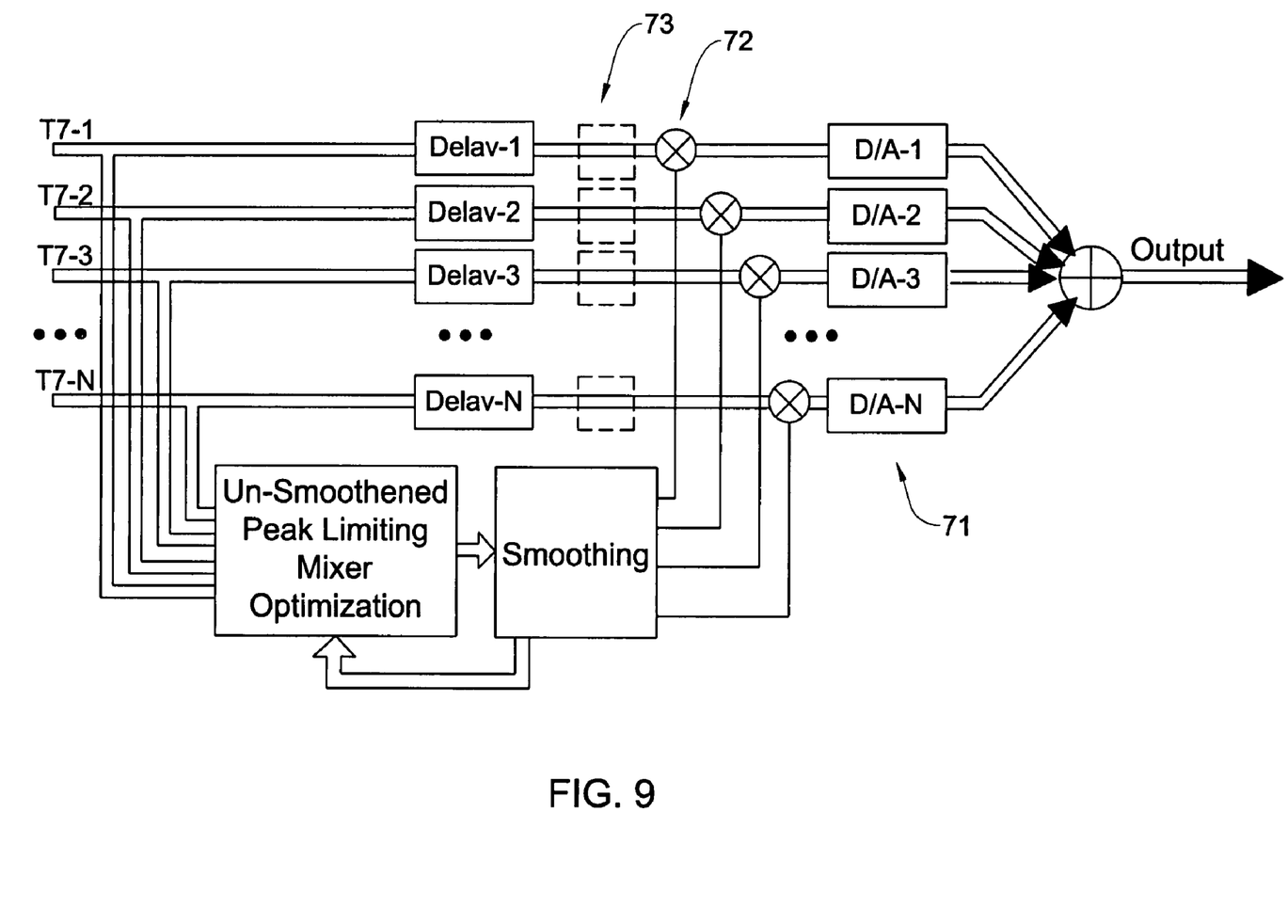
FIG. 9 illustrates a generalized block diagram of a peak limiting mixer according to an embodiment of the invention.

By way of non limiting example, this is illustrated in FIG. 9 which is similar to FIG. 8, except for the fact that digital-to-analog conversion (71) is applied to signals before mixing, and consequently mixing is performed in the analog domain.

In another embodiments, other steps of the processing can be performed in the analog domain, e.g. applying the digital to analog conversion before applying the smooth attenuation (72) (see DAC modules 73 marked in dash lines instead of DAC modules 71). The latter embodiments also illustrate in a non limiting manner situations where signals that include the input signals (e.g. after being subjected to digital to analog conversion) are mixed.

The application of digital conversion before mixing is, of course, not limited to the specific example illustrated in FIG. 9. Thus by way of another example the input signals can be in the analog form. Note also that in the context of peak limiting, the smooth attenuation signals described herein with reference to the various aspects and embodiments of the invention can recover to unity (no attenuation applied) within a fraction of a second, and whenever desired in less than 100 ms.

In accordance with an aspect of the invention, the smoothened attenuation signals are calculated taking into account the input signals, the smooth signal criteria whilst assuring that the mixed signal is peak limited and by further maintaining the relative levels between channels. This applies for instance for stereo case, multi channels case, sub group multi channels case and Linked down mix case, all as specified above.

In accordance with another aspect of the invention, the relative levels between channels is maintained whilst not necessarily utilizing the smooth signal criteria. Thus, in accordance with this aspect of the invention, the attenuation signals are calculated taking into account the input signals, whilst assuring that the mixed signal is peak limited and by further maintaining the relative levels between channels. This applies for instance for stereo case, multi channels case, sub group multi channels case and Linked down mix case, all as specified above.

Still further in accordance with an aspect of the invention the specified target functions and constraint do not employ smooth signal criteria considerations. Thus, by one embodiment for the optimized stereo link discussed above the constraint $0<A(n)<=PA(n)$ does not apply and instead the condition, e.g. $0<A(n)<=1$ can be used. In accordance with another embodiment this applies also for the Weighted Optimized stereo link case. In accordance with still another embodiment for the Linked multi channels case discussed above the constraint range $0<A(n)<=PA(n)$ does not apply and instead the condition, e.g. $0<PA(n)<=1$ can be used.

In accordance with still another embodiment of this aspect of the invention the use of smooth signal criteria is obviated for the Sub group linked multi channels case, or in accordance with still another embodiment of this aspect it applies also to the Linked down mix case.

In accordance with yet another embodiments of the invention the smooth signal criteria is obviated not necessarily in the context of maintaining the relative levels between channels. Thus, it also applies to the Tracks Separation Control embodiments described above. In other words, for this aspect the smooth signal criteria is not used, e.g. in the monophonic un-weighted maximum gain target function discussed above where the constraint $0<A(n)<=PA(n)$ does not apply and instead e.g. the condition $O<A(n)<=1$ is used. The same applies by still another embodiment to the Monophonic weighted maximum gain target function, discussed above.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

The present invention has been described with a certain degree of particularity, but those versed in the art will readily appreciate that various alterations and modifications may be carried out, without departing from the scope of the following claims:

The invention claimed is:

1. A method for processing audio signals, comprising:
   (a) receiving a plurality of audio signals and calculating signal levels thereof;
   (b) calculating a smooth attenuation signal for each one of said plurality of audio signals, such that a result of mixing of said plurality of audio signals multiplied by their respective smooth attenuation signals is peak limited by given threshold level, wherein the calculated smooth attenuation signal of each one of said plurality of audio signals at a given time is based on the calculated signal levels of said plurality of audio signals, said given threshold level and a smoothing criterion based upon a predicted smooth attenuation signal value of that one of said plurality of audio signals, and wherein, at least during certain time intervals, the calculated smooth attenuation signal of at least one of said plurality of audio signals produces surplus attenuation of that signal, said surplus attenuation being the additional attenuation produced by the smoothing, and the surplus attenuation is used to reduce the calculated smooth attenuation signal of at least another one of said plurality of audio signals; and
   (c) mixing said plurality of audio signs is multiplied by their respective calculated smooth attenuation values.

2. The method according to claim 1, wherein said calculating a smooth attenuation signal includes modifying an attenuation value of a first signal of the plurality of audio signals if at least a second of the plurality of audio signals is already attenuated due to smoothing, and wherein said modifying includes reducing the attenuation when the first and the second signals have the same polarity and increasing the attenuation when the first and the second signals have opposite polarities.

3. The method according to claim 1, wherein said calculating a smooth attenuation signal comprises implementing a worst-case prediction for calculating said predicted smooth attenuation signal value of that one of said plurality of audio signals, such that worst-case prediction errors will not result in exceeding the threshold.

4. The method according to claim 3, wherein said worst-case prediction includes: for a signal, from among said plurality of audio signals having the same polarity, the worst-case prediction is the minimum attenuation possible, and for a signal, from among said plurality of audio signals, with an opposite polarity, the worst-case prediction is the maximum attenuation possible.

5. The method according to claim 1, wherein said calculating further comprises for each one of said plurality of audio signals, assigning a cost for a certain frequency content in a smooth attenuation signal of that one of said plurality of audio signals, whereby the calculated smooth attenuation signal of each one of said plurality of audio signals at a given time is further based on the frequency content of the predicted smooth attenuation signal of at least that one of sad plurality of audio signal.

6. The method according to claim 1, wherein said calculating a smooth attenuation signal further comprises controlling a desired level of relative attenuation difference between signals.

7. The method according to claim 6, wherein said controlling includes applying cross feed between signals.

8. The method according to claim 6, wherein said controlling includes applying reduced filters Q.

9. The method according to claim 1, further comprising: calculating smooth attenuation signal for each one of said plurality of audio signals, such that inter modulations between signals are reduced.

10. The method according to claim 1, wherein at least one signal from the plurality of audio signals includes at least two channels and wherein said calculating a smooth attenuation signal further comprises controlling a desired level of relative attenuation difference between channels or group of channels of said at least one signal from said plurality of audio signals.

11. The method according to claim 10, wherein the controlling includes applying worst case linking.

12. The method according to claim 10, wherein each of the plurality of audio signals includes two channels and wherein said controlling includes applying an optimized stereo link.

13. The method according to claim 10, wherein each of the plurality of audio signals includes two channels and wherein said controlling includes applying an optimized weighted stereo link.

14. The method according to claim 10, wherein each of the plurality of audio signals includes multi-channels and wherein said controlling includes applying an optimized multi-channel link.

15. The method according to claim 14, wherein said multi-channels are 5.1 channels.

16. The method according to claim 10, wherein each of the plurality of audio signals includes multi-channels and wherein said controlling includes applying an optimized sub-groups multi-channel link.

17. The method according to claim 16, wherein said multi channels are 5.1 channels.

18. The method according to claim 7, wherein said sub groups include one or more of the following groups:
   a. (LeftFront, RightFront, Center, LeftSurround, RightSurround, Sub);
   b. (LeftFront, RightFront, Center, LeftSurround, Right Surround), (Sub);
   c. (LeftFront, RightFront, Center), (LeftSurround,Right Surround), (Sub);
   d. (LeftFront, RightFront), (Center), (LeftSurround, Right Surround), (Sub); and
   e. (LeftFront), (RightFront), (Center), (LeftSurround), (RightSurround), (Sub).

19. The method according to claim 1, wherein said plurality of audio signals are in multiple tracks.

20. The method according to claim 19, wherein each of the multiple tracks includes at least two bands.

21. The method according to claim 1, wherein said plurality of audio signals are in multiple frequency bands of an audio signal.

22. The method according to claim 1, wherein each one of said plurality of audio signals includes at least two channels.

23. The method according to claim 16, wherein said channels are stereo channels.

24. The method according to claim 16, wherein said channels are surround 5.1.

25. The method according to claim 1, for use in professional audio production.

26. The method according to claim 1, for use in radio tele-broadcasting.

27. The method according to claim 1, wherein, at least one of the smooth attenuation signals calculated for each one of said plurality of audio signals is restored to unity within less than 100 m sec.

28. The method according to claim 1, wherein said calculating a smooth attenuation signal for each one of said plurality of audio signals is performed autonomously for each signal.

29. The method according to claim 1, wherein said calculating a smooth attenuation signal for each one of said plurality of audio signals is performed centrally for said plurality of audio signals.

30. A method for calculating control signals for a peak-limiting mixer, comprising:
   (a) receiving a plurality of audio signals; and
   (b) computing an optimized smooth attenuation signal for each one of said plurality of audio signals, on the basis of: a target function that is a function of selected attenuation values and that returns values that correspond to a relation between the selected attenuation values and a target; and a constraint on the peak level of a mixed signal resulting from mixing of said plurality of audio signals when multiplied by their respective optimized smooth attenuation signals not to exceed a given threshold, wherein said computing step is performed to cause the optimized smooth attenuation signal of at least one of said plurality of audio signals to produce, at least during certain time intervals, surplus attenuation of that signal, said surplus attenuation being the additional attenuation produced by the smoothing, and the surplus attenuation is used to reduce the computed smooth attenuation signal of at least another one of said plurality of audio signals, such that said computing step provides attenuation values, which while maintaining said constraints, result in maximal or minimal target function values.

31. The method according to claim 30, wherein said target function is a Monophonic un-weighted maximum gain target function.

32. The method according to claim 31, wherein said Monophonic un-weighted maximum gain target function includes: given instantaneous values of N signals $S(n)$ for $n=0 \ldots N-1$; and predictions of N smooth attenuation values $0 < PA(n) <= 1$;
find N new attenuation values $A(n)$, in the range $0 < A(n) <= PA(n)$, such that:

$$\left|\sum_{n=0}^{N-1}(S(n)*A(n))\right| <= \text{Threshold}$$

while $$\prod_{n=0}^{N-1}A(n)$$

is maximized.

33. The method according to claim 30, wherein said target function is a Monophonic weighted maximum gain target function.

34. The method according to claim 33, wherein said Monophonic-weighted maximum gain target function includes:
given instantaneous values of N signals S(n) for n=0..N-1; and N weighting factors 0<W(n)<1;
and predictions of N smooth attenuation values 0<PA(n)<=1;
find N new control values A(n), in the range 0<A(n)<=PA(n), such that:

$$\left|\sum_{n=0}^{N-1}(S(n)*A(n))\right| <= \text{Threshold}$$

while $$\prod_{n=0}^{N-1}A(n)^{W(n)}$$

is maximized.

35. The method according to claim 30, further comprising constraining the attenuation signals so that relative attenuation differences between signals can not exceed a certain threshold.

36. The method according to claim 35, wherein said constraining includes Reducing Separation through Cross feed between signals.

37. The method according to claim 35, wherein said constraining includes Reducing Separation through reduced filters Q.

38. The method according to claim 30, wherein at least one the plurality of audio signals includes at least two channels which are associated with one another, and further comprising constraining a desired level of relative attenuation difference between the two or more associated channels.

39. The method according to claim 38, wherein said constraining includes applying worst case linking.

40. The method according to claim 38, wherein each of the plurality of audio signals includes two channels and wherein said constraining includes applying an optimized stereo link.

41. The method according to claim 40, wherein said optimized stereo link includes:
given instantaneous values of N left-channel signals L(n) for n=0..N-1;
and instantaneous values of N right-channel signals R(n) for n=0..N-1; and predictions of N smooth attenuation values 0<PA(n)<=1;
find N new control values A(n), in the range 0<A(n)<=PA(n), such that:

$$\left|\sum_{n=0}^{N-1}(L(n)*A(n))\right| <= \text{Threshold, and;} \quad (a)$$

$$\left|\sum_{n=0}^{N-1}(R(n)*A(n))\right| <= \text{Threshold;} \quad (b)$$

while $$\prod_{n=0}^{N-1}A(n)$$

is maximized.

42. The method according to claim 38, wherein each signal includes two channels and wherein said constraining includes applying optimized weighted stereo link.

43. The method according to claim 38, wherein each of the plurality of audio signals includes multi-channels and wherein said constraining includes applying optimized multi-channel link.

44. The method according to claim 43, wherein said multi-channels are 5.1 channels.

45. The method according to claim 38, wherein each of the plurality of audio signal includes multi-channels and wherein said constraining includes applying optimized sub-groups multi-channel link.

46. The method according to claim 45, wherein said multi channels are 5.1 channels.

47. The method according to claim 46, wherein said sub groups include one or more of the following groups:
a. (LeftFront, RightFront, Center, LeftSurround, RightSurround, Sub);
b. (LeftFront, RightFront, Center, LeftSurround, RightSurround), (Sub);
c. (LeftFront, RightFront, Center), (LeftSurround, RightSurround), (Sub);
d. (LeftFront, RightFront), (Center), (LeftSurround, Right Surround), (Sub); and
e. (LeftFront), (RightFront), (Center), (LeftSurround), (RightSurround), (Sub).

48. The method according to claim 1, wherein at least said mixing is performed in an analog domain.

49. The method according to claim 1, wherein said plurality of audio signals are digital audio signals.

50. The method according to claim 30, wherein said plurality of audio signals are digital audio signals.

51. The method according to claim 14, wherein said multi-channels of each of the plurality of audio signals are one of the following:
a. 7.1 channels; and
b. 10.2 channels.

52. The method according to claim 16, wherein said multi-channels of each of the plurality of audio signals are one of the following:
a. 7.1 channels; and
b. 10.2 channels.

53. The method according to claim 16, wherein said multi-channels of each one of said plurality of audio signals are one of the following:
 a. surround 7.1; and
 b. surround 10.2.

54. The method according to claim 43, wherein said multi-channels of each one of the plurality of audio signals are one of the following:
 a. 7.1; and
 b. 10.2.

55. The method according to claim 54, wherein said multi-channels of each of the plurality of audio signals are one of the following:
 a. 7.1; and
 b. 10.2.

56. A program storage device readable by machine, tangibly embodying a program of instructions executable by the machine to perform method steps for processing digital audio signals, comprising:
 (a) receiving a plurality of audio signals and calculating signal levels thereof;
 (b) calculating a smooth attenuation signal for each one of said plurality of digital audio signals, such that a result of mixing of said plurality of audio signals multiplied by their respective smooth attenuation signals is peak limited by a given threshold level, wherein the calculated smooth attenuation signal of each one of said plurality of audio signals at a given time is based on the calculated signal levels of said plurality of audio signals, said given threshold level and a smoothing criterion based upon a predicted smooth attenuation signal value of that one of said plurality of audio signals, and wherein, at least during certain time intervals, the calculated smooth attenuation signal of the at least one of said plurality of audio signals produces surplus attenuation of that signal, said surplus attenuation being the additional attenuation produced by the smoothing, and the surplus attenuation is used to reduce the calculated smooth attenuation signal of at least another one of said plurality of audio signals; and
 (c) mixing said plurality of audio signal multiplied by their respective calculated smooth attenuation values.

57. A program storage device readable by machine, tangibly embodying a program of instructions executable by the machine to perform method steps for calculating a control signals for a peak-limiting mixer, comprising:
 (a) receiving a plurality of audio signals; and
 (b) computing an optimized smooth attenuation signal for each one of said plurality of audio signals, on the basis of: a target function that is a function of selected attenuation values and that returns values that correspond to a relation between the selected attenuation values and a target; and a constraint on the peak level of a mixed signal resulting from mixing of said plurality of audio signals when multiplied by their respective optimized smooth attenuation signals not to exceed a given threshold; and a constraint that the attenuation signals be smooth, such that said computing step provides attenuation values, which while maintaining said constraints, result in maximal or minimal target function values, wherein, at least during certain time intervals, the optimized smooth attenuation signal of at least one of said plurality of audio signals provided by said computing step produces surplus attenuation of that signal, said surplus attenuation being the additional attenuation produced by the smoothing, and the surplus attenuation is used to reduce the computed smooth attenuation signal of at least another one of said plurality of audio signals.

* * * * *